United States Patent

Sun et al.

Patent Number: 6,105,567
Date of Patent: Aug. 22, 2000

[54] WAFER SAWING APPARATUS HAVING WASHING SOLUTION SPRAY AND SUCTION DEVICES FOR DEBRIS REMOVAL AND HEAT DISSIPATION

[75] Inventors: Yong Kyun Sun; Sam Bok Jang, both of Cheonan; Dong Sung Jang, Asan, all of Rep. of Korea

[73] Assignee: Samsung Electronics Co., Ltd., Suwon, Rep. of Korea

[21] Appl. No.: 09/019,121

[22] Filed: Feb. 5, 1998

[30] Foreign Application Priority Data

May 29, 1997 [KR] Rep. of Korea ................. 97-21503

[51] Int. Cl.$^7$ ................................................ B28D 1/04
[52] U.S. Cl. ............................... 125/13.01; 451/450
[58] Field of Search ......................... 125/13.01, 23.01, 125/14, 11.22; 451/450, 53

[56] References Cited

U.S. PATENT DOCUMENTS

| 4,558,686 | 12/1985 | Ono ................................. | 125/13.01 |
| 4,569,326 | 2/1986 | Tanizaki et al. ................ | 125/13.01 |
| 5,718,615 | 2/1998 | Boucher et al. .................. | 83/62 |

FOREIGN PATENT DOCUMENTS

| 0356658 | 3/1938 | Italy ................................ | 125/23.01 |
| 0111506 | 4/1980 | Japan ............................. | 125/23.01 |
| 2193773 | 8/1987 | Japan ............................. | 451/450 |
| 0016611 | 1/1989 | Japan ............................. | 125/23.01 |
| 1237401 | 6/1986 | U.S.S.R. ........................ | 451/450 |

*Primary Examiner*—Robert A. Rose
*Attorney, Agent, or Firm*—Jones Volentine, LLC

[57] ABSTRACT

A wafer sawing apparatus scribes a wafer having a plurality of ICs which are separated from each other by a plurality of scribe streets so as to cut the wafer into individual ICs. During scribing, silicon particles are produced and heat is generated as the scribing blade abrades the wafer surface. These silicon particles may remain on the surface of the ICs and cause defects in later manufacturing processes. Therefore, the wafer sawing apparatus has two side nozzles, one positioned on each side of the scribing blade to spray a washing solution onto the scribing blade and a top surface of the wafer through an arc having a designated angle, and a center nozzle which is positioned adjacent to and ahead of a cutting edge of the scribing blade in the driving direction, which also sprays the washing solution onto the scribing blade and the top surface of the wafer at a designated downward angle. The wafer sawing apparatus is also equipped with a suction device for suctioning the silicon particles from the top surface of the wafer, at the point where the particles are produced from the wafer by the scribing blade.

12 Claims, 5 Drawing Sheets

WAFER SAWING APPARATUS HAVING WASHING SOLUTION SPRAY AND SUCTION DEVICES FOR DEBRIS REMOVAL AND HEAT DISSIPATION

BACKGROUND OF THE INVENTION

1. Field of the Invention

The present invention generally relates to a wafer sawing apparatus, and more particularly to a wafer sawing apparatus which can remove substantially all of the silicon particles as well as dissipate any heat which is generated by the friction between the wafer and the scribing blade during the wafer sawing process.

2. Background of the Related Art

In semiconductor device fabrication, a wafer sawing process is performed to divide a silicon wafer on which a plurality of integrated circuits (ICs) are formed into separate individual semiconductor chips by using a wafer sawing apparatus having a diamond-pointed scribing blade.

FIG. 1 is a perspective view depicting a conventional wafer sawing apparatus. In FIG. 1, a wafer sawing apparatus 100 is used in wafer scribing equipment, for example, model DFD-640 which is manufactured by DISCO (Japan). Referring to FIG. 1, the wafer sawing apparatus 100 has a scribing blade 70 combined with an output shaft 64 of a spindle motor 62, the output shaft 64 and the scribing blade 70 being rotated by the force of the spindle motor 62. Two side nozzles 72 for ejecting a washing solution 90 are positioned on each side of the scribing blade 70 and are connected to a body 66 of the wafer sawing apparatus 100. Each side nozzle 72 comprises a plurality of separate sub-nozzles 76. A center nozzle 74 also for ejecting the washing solution 90 is positioned adjacent to and aligned with the cutting edge of the scribing blade 70, is located ahead of the cutting edge in the driving direction, and is also connected to the body 66 of the wafer sawing apparatus 100.

By using the wafer sawing apparatus 100, the wafer sawing process is performed as follows to divide a silicon wafer on which a plurality of integrated circuits (ICs) are formed into a plurality of separate individual semiconductor chips. After loading the wafer 50 which has a plurality of the ICs 52 onto a table 42, the scribing blade 70 which is combined with the output shaft 64 of the body 66 is rotated by the spindle motor 62 of the wafer sawing apparatus 100, and scribes the wafer 50 along scribe lines or scribe streets 54. Then, the wafer 50 is divided into a plurality of separate individual ICs 52.

As the above-stated scribing blade 70 scribes the wafer 50, it abrades the silicon away, producing small silicon particles or debris. The silicon particles which remain on the top surface of the wafer after the wafer sawing process has been completed cause many failures in subsequent manufacturing processes, for example failures in the wirebonding or the molding processes. Further, the heat which is generated by the friction between the wafer 50 and the scribing blade 70 may damage the ICs 52 on the wafer 50. Therefore, the wafer sawing apparatus 100 utilizes the side nozzles 72, which spray the washing solution 90 onto the top surface of the wafer 50, and the center nozzle 74, which sprays the washing solution 90 onto the scribing blade 70, during or after the wafer sawing process, in order to flush away the silicon particles and to dissipate the heat. The washing solution 90 which is ejected through the side nozzles 72 and the center nozzle 74 attempts to cool the heated scribing blade 70 and the heated wafer 50. Further, the washing solution 90 attempts to clean the top surface of the wafer 50 and reduce the friction between the scribing blade 70 and the wafer 50. In general, DI water (deionized water) is used as the washing solution 90.

However, the wafer sawing method using the above-described wafer sawing apparatus 100 cannot throughly flush away all the silicon particles, and some abraded silicon particles remain on the top surface of the wafer. Also, fine particles of silicon float in the air and settle onto the top surface of the wafer. Consequently, these abraded and fine particles of silicon disturb the subsequent manufacturing processes.

Such contamination is of even greater concern when manufacturing charge coupled devices (CCDs), which are assembled under a class 10 or less cleanliness condition. The fine particles of silicon and inductive dust which settle onto the top surface of the device on the wafer cause failures by adversely affecting the monitor or screen of a product incorporating the CCDs. The term 'class' means a cleanliness condition having the indicated number of particles with a diameter of 0.5 $\mu$m or more per 1 ft$^3$. For example, devices other than the CCDs are generally assembled under cleanliness conditions of approximately class 1000.

Therefore, the silicon particles remaining on the top surface of the wafer reduce the yield and productivity, and further deteriorate the performance of the products which are made from the wafer.

SUMMARY OF THE INVENTION

Accordingly, an object of the present invention is to provide a wafer sawing apparatus which can remove substantially all of the silicon particles from the wafer and dissipate the heat which is generated during the wafer sawing process, and to increase the yield and productivity of the assembly process of semiconductor devices such as IC devices.

The foregoing and other objects are achieved by a wafer sawing apparatus for scribing a wafer having a plurality of ICs which are separated from each other by a plurality of scribe streets to provide individual ICs, the wafer sawing apparatus comprising: a scribing blade which rotates and moves along the scribe streets; an ejection assembly comprising two side nozzles and a center nozzle, the side nozzles being positioned on each side of the scribing blade and ejecting a washing solution onto the scribing blade and a top surface of the wafer through an arc measuring a designated angle, and the center nozzle being positioned adjacent to and ahead of a cutting edge of the scribing blade in a driving direction of the scribing blade and ejecting the washing solution at a designated angle relative to horizontal onto the scribing blade and the top surface of the wafer; and a suction means for suctioning silicon particles from the top surface of the wafer, where the particles are created by the scribing blade abrading the wafer along the scribe streets.

BRIEF DESCRIPTION OF THE ATTACHED DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF PREFERRED EMBODIMENTS

A preferred embodiment of the present invention will be described below with reference to the accompanying drawings.

Figure 1:
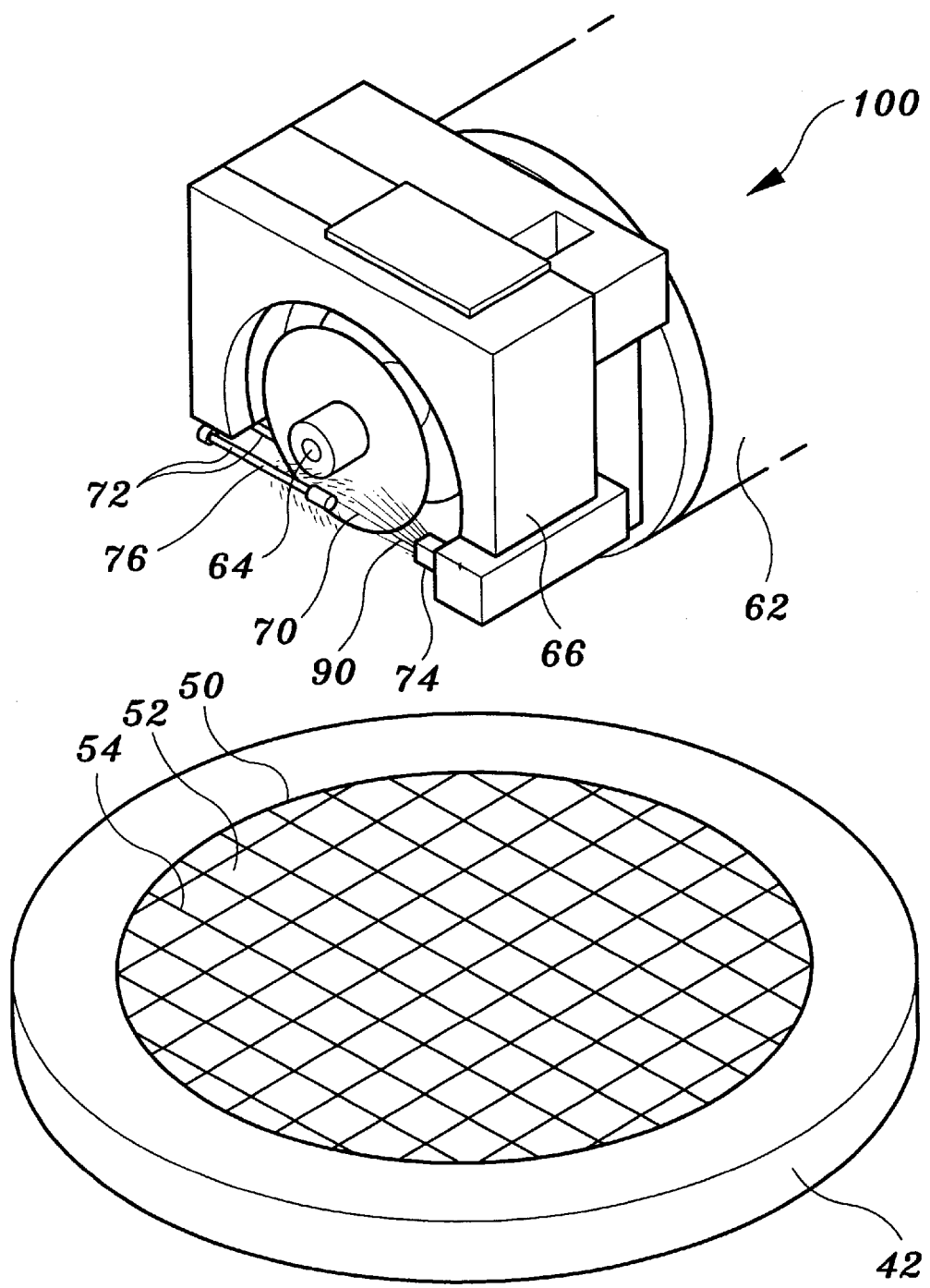
FIG. 1 is a perspective view depicting a conventional wafer sawing apparatus.
Figure 2:
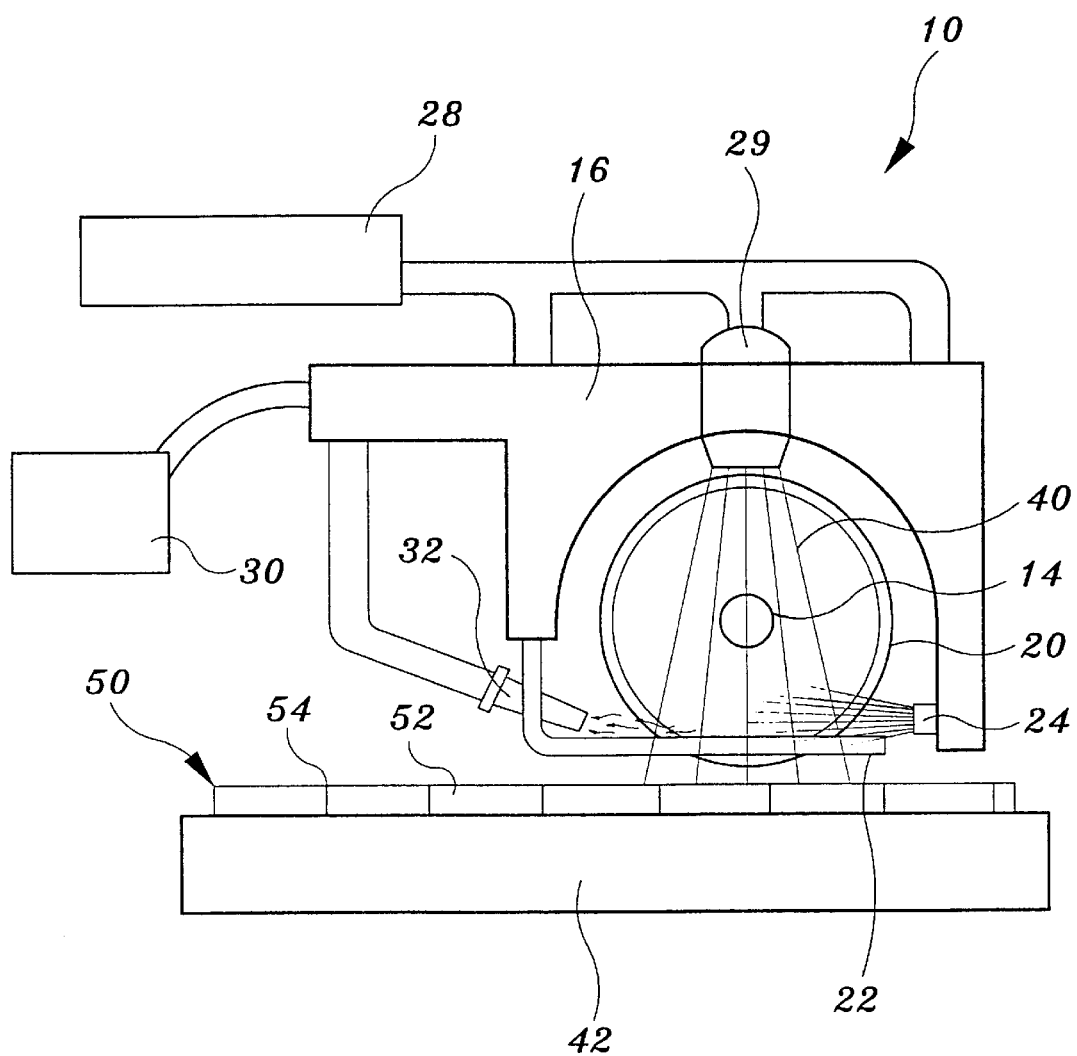
FIG. 2 is a side view depicting a wafer sawing apparatus according to the present invention.

FIG. 2 is a side view depicting a wafer sawing apparatus according to the present invention. With reference to FIG. 2, a wafer 50 is provided, having a plurality of integrated circuits (ICs) 52 formed thereon, which are separated from each other by a plurality of scribe streets 54. The thickness of the wafer 50 is approximately 680 μm. As an example, these ICs 52 may be the basic driving circuits for charged coupled devices CCDs. In the case of CCDs, the top surface of the wafer 50 on which the plurality of ICs 52 are formed has no passivation layer, unlike other conventional wafers, since the top surfaces of the ICs 52 function as camera lenses. Since the top surface on which the ICs are formed has no passivation layer, the surface is easily damaged by external environmental conditions and stresses. Therefore, it is necessary that the wafer sawing process be performed carefully. In FIG. 2, the wafer 50 is loaded on the upper surface of the table 42 in order to scribe the wafer into the separate individual ICs.

A wafer sawing apparatus 10 is disposed above the wafer 50. The wafer sawing apparatus 10 has a scribing blade 20 rotating about an output shaft 14 of a spindle motor (not shown) which is connected to a body 16 of the wafer sawing apparatus 10. Two side nozzles 22, a center nozzle 24, an upper nozzle 29, and a suction nozzle 32 are connected to the body 16 of the wafer sawing apparatus 10. One side nozzle 22 is positioned on each side of the scribing blade 20, and each side nozzle 22 comprises a plurality of separated sub-nozzles (not shown). The center nozzle 24 is positioned adjacent to and aligned with the cutting edge of the scribing blade 20, and is located ahead of the cutting edge in the driving direction. The upper nozzle 29 is installed above and adjacent to the cutting edge of the scribing blade 20. The suction nozzle 32 is positioned behind and adjacent to the cutting edge of the scribing blade 20 in the driving direction. Herein, the side, the center, and the upper nozzles 22, 24, and 29 are attached to a body 16 of the wafer sawing apparatus 10, and are also connected to a tank 28 containing a washing solution 40 for spraying the washing solution 40 at a predetermined pressure. The suction nozzle 32 is connected to a vacuum suction pump 30 for supplying suction force.

Figure 3:
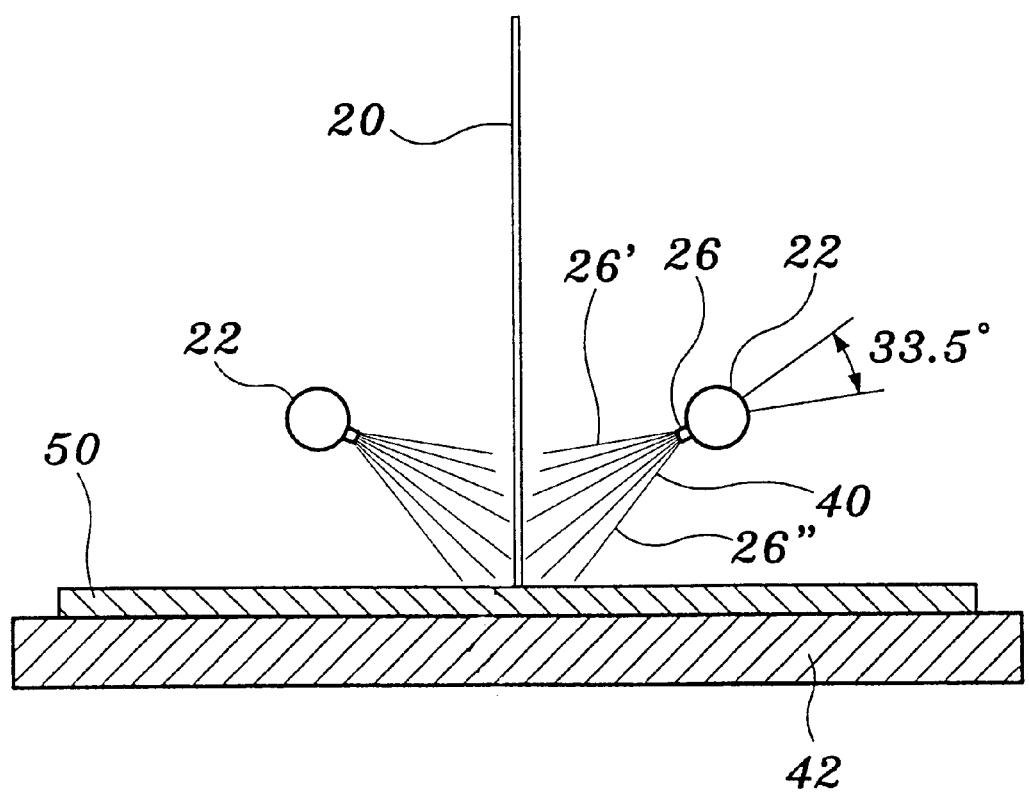
FIG. 3 is a cross-sectional view depicting the spraying of a washing solution through separate sub-nozzles of side nozzles in the wafer sawing apparatus of the present invention.

FIG. 3 is a cross-sectional view depicting the spraying of washing solution through separate sub-nozzles of side nozzles 22 in the wafer sawing apparatus 10. With reference to FIG. 3, a plurality of the sub-nozzles 26 of the side nozzle 22 spray the washing solution 40 outward over an arc measuring about 33.5° onto the scribing blade 20 and the top surface of the wafer 50. Herein, the angle of 33.5° means that the angle between the uppermost line of spray 26' and the lowermost line of spray 26" of the washing solution 40 sprayed through the side nozzle 22 is 33.5°. According to the present invention, therefore, the spray trajectory of the sub-nozzles 26 of the side nozzle 22 is broadened to about 33.5° so that the washing solution 40 ejected through the side nozzles 22 simultaneously sprays the scribing blade 20 and the top surface of the wafer 50.

Figure 4:
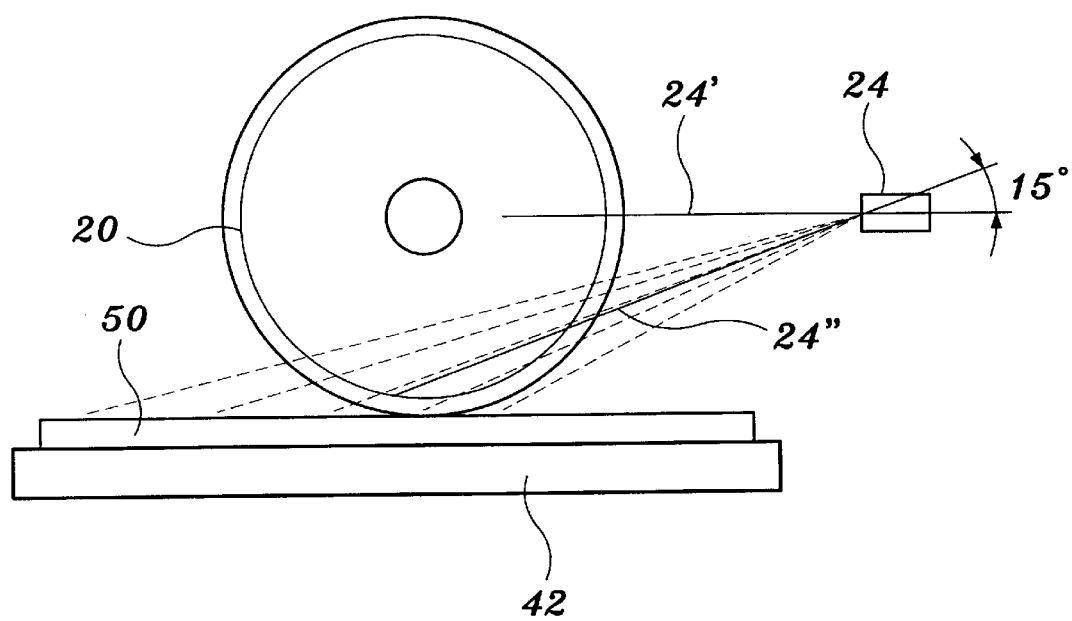
FIG. 4 is a side view depicting the spraying of a washing solution through a center nozzle in the wafer sawing apparatus of the present invention.

FIG. 4 is a side view depicting the spraying of a washing solution through center nozzle 24 of wafer sawing apparatus 10. With reference to FIG. 4, the center nozzle 24 is positioned ahead of the cutting edge of the scribing blade 20 in the driving direction, to provide both a cooling effect, which cools the heated scribing blade 20, and a cleaning effect, which flushes away the silicon particles created in the wafer sawing process. The center nozzle 24 is aimed so that an angle between a horizontal line 24' which passes through the center of the center nozzle 24 and a central line 24" passing through the center of the arc of the spray of the washing solution 40 sprayed through the center nozzle 24 is 15° in a downward direction. In other words, the washing solution 40 ejected through the center nozzle 24 is sprayed not only onto the scribing blade 20, but also onto the top surface of the wafer 50 due to the designated 15° downward angle. As a result, side nozzles 22 remove silicon particles from the top surface of the wafer 50 and smooth the top surface of the wafer 50, and center nozzle 24 removes silicon particles from the top surface of the wafer 50 and cools the heated scribing blade 20.

Figure 5:
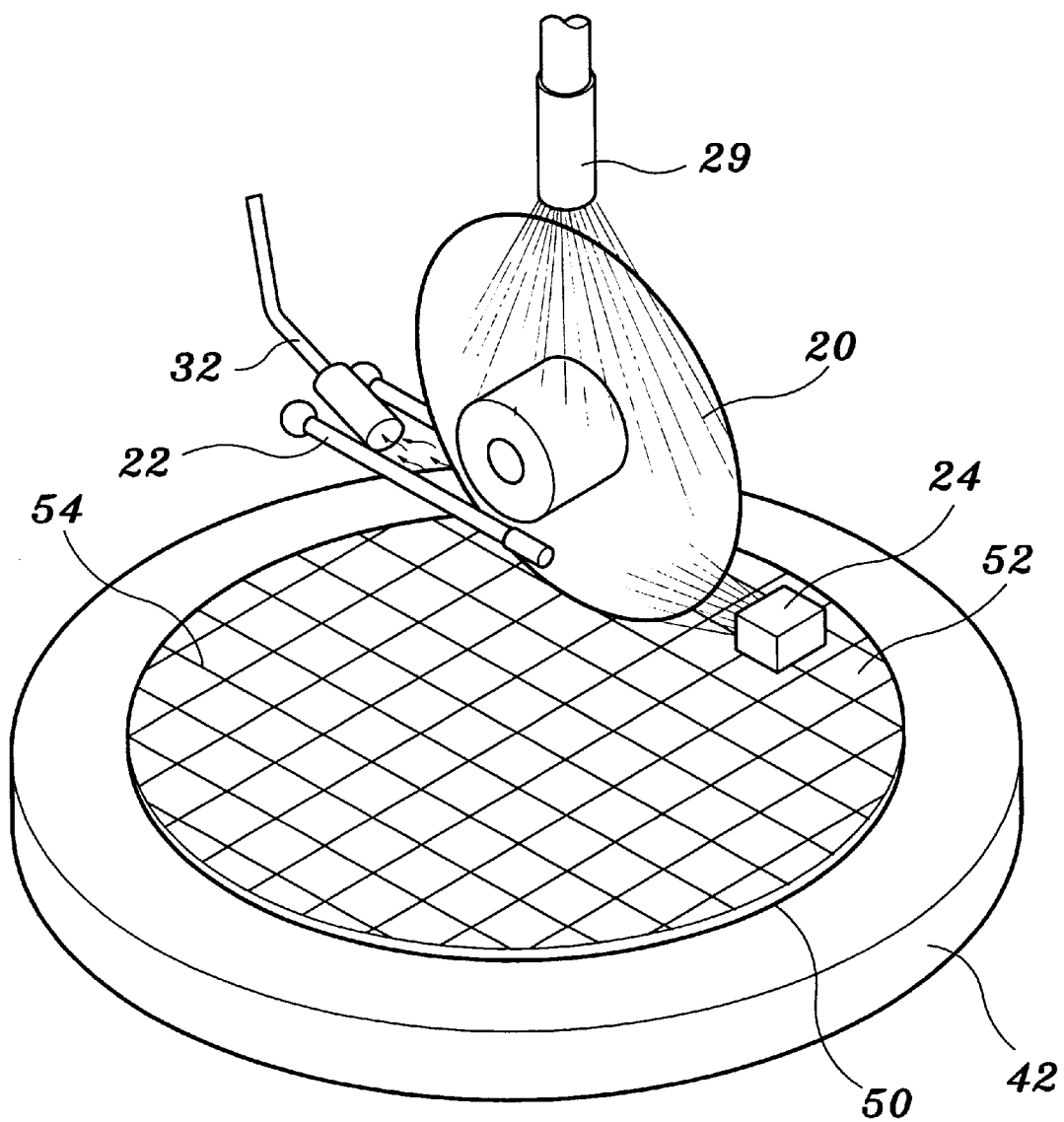
FIG. 5 is a perspective view depicting the operation of the wafer sawing apparatus according to the present invention.

FIG. 5 is a perspective view depicting the operation of the wafer sawing apparatus according to the present invention. With reference to FIG. 5, the wafer 50 is loaded on a table 42 and the rotating scribing blade 20 of the wafer sawing apparatus 10 is lowered onto the top surface of the wafer 50 so as to contact the scribe streets 54 of the wafer 50. The wafer 50 is scribed along the scribe streets 54 and divided into a plurality of separate individual ICs 52. At this time, DI water (deionized water) having a conductivity of about 200–400 kΩm, which is used as the washing solution 40, is ejected perpendicular to the top surface of the wafer 50 through upper nozzle 29 at a pressure in a range of about $120\pm20$ kg/cm², preferably 120 kg/cm². At the same time, the center nozzle 24 ejects washing solution 40 at an angle of 15° downwards and side nozzles 22 eject washing solution 40 over an arc of about 33.5° at a rate of 1 liter per minute (l/min). The washing solution 40 ejected through the side, the center, and the upper nozzles 22, 24, and 29 is sprayed onto the top surface of the wafer 50 as well as the scribing blade 20, and thereby flushes away the silicon particles which are created in the wafer sawing process and also cools the heated scribing blade 20 and the heated wafer 50.

During the operations of the side, the center, and the upper nozzles 22, 24, and 29, the vacuum suction pump 30 supplies a suction force of about 1080 Pa through the suction nozzle 32. Therefore, the silicon particles and washing solution 40 are suctioned through the suction nozzle 32, as soon as the particles are generated. It is preferable that the suction through the suction nozzle 32 is activated before the ejection of the washing solution through the side 22, the center 24, and the upper nozzles 29. Fine particles as well as large-sized particles among the silicon particles which are created in the wafer sawing process are suctioned through the suction nozzle 32. Therefore, by using the suction nozzle 32 of the present invention, the silicon particles can be more effectively removed.

The preferable ejection angles of the side nozzles 22 and the center nozzle 24 are in the ranges of about $33.5\pm10°$, and about $15\pm10°$, respectively, in order to improve the cleaning and the cooling affects. It is most preferable that the upper nozzle is installed above the wafer and the scribing blade, and the suction means is positioned adjacent to and behind the cutting edge of the scribing blade, and the ejection angles of the side nozzles 22 and the center nozzle 24 are 33.5° and 15° downwards, respectively.

A wafer sawing process in which the wafer is scribed into the separate individual ICs by using the wafer sawing apparatus according to the present invention was carried out, and the yield was measured. The test results are listed in Table 1 below.

TABLE 1

Test Results Of Wafer Sawing Process At Various Nozzle Angles

| Applicability | Nozzle Angle (Center) | Nozzle Angle (Side) | Wafer Status | Assembly Yield | Test Yield | Total Yield |
|---|---|---|---|---|---|---|
| Improper | 0° | 23.0° |  | 88.7% | 65.6% | 58.2% |
| Improper | 15° | 23.0° |  | 87.0% | 69.0% | 60.2% |
| Proper (applicable) | 15° | 33.5° |  | 92.0% | 80.3% | 74.2% |

In this test, both the ejection of the washing solution through the side, the center, and the upper nozzles, and the suctioning of the silicon particulates through the suction nozzle were carried out.

In the first example, the wafer was scribed by a wafer sawing apparatus comprising the center nozzle having an angle of 0° and the side nozzles having an angle of 23.0°, which is the same as the conventional wafer sawing apparatus. As shown by the "Wafer Status" column, all the silicon particulates could not be removed and remained on four edges of the top surface of the wafer. In this case, the yield of the ICs after the assembly process ("Assembly Yield") was 88.7%, the yield after the test process ("Test Yield") was 65.6%, and the yield after the assembly and the test processes ("Total Yield") was 58.2%. The term "Test Yield" means the yield after accomplishing the mounting process.

In a second example, the ejection angle of the center nozzle was changed to 15° downward and the ejection angle of the side nozzle was the same as that of the first example, i.e., 23°. As shown in the "Wafer Status" column, the silicon particles remained on two edges of the top surface of the wafer. The Assembly Yield was 87.0%, the Test Yield was 69.0%, and the Total Yield after the assembly and the test processes was 60.2%. Note that the Total Yield increased as compared to the first example.

In a third preferred example, the ejection angles of the center and the side nozzles were changed to 15° and 33.5°, respectively. As shown in the "Wafer Status" column, no silicon particles remained on any regions of the top surface of the wafer. In other words, the silicon particulates were throughly removed during the wafer sawing process. In this case, yields after the assembly process, the test process, and total yield after the assembly and the test processes were respectively 92.0%, 80.3%, and 74.2%. As compared to the first conventional case, yield after the assembly, yield after the test process, and total yield after the assembly and the test processes increased respectively in an amount of 3.3%, 14.7%, and 16%. By using the wafer sawing apparatus according to the third example, all the silicon particles can be removed and none of the silicon particles remain on top surfaces of the ICs of the wafer. Therefore, the total yield can be remarkably increased, because failures due to the residues of the silicon particles are reduced in the subsequent manufacturing processes.

As shown in the above-described embodiment, in the wafer sawing process using a wafer sawing apparatus according to the present invention, the ejection angles of the center nozzle and the side nozzles are broadened, and then the washing solution is ejected through the center and the side nozzles to the wafer. Therefore, the washing solution is not only sprayed onto the scribing blade, but also onto the top surface of the wafer. Further, the washing solution is ejected through the upper nozzle perpendicular to the top surface of the wafer at high pressure. The ejecting of the washing solution through the center, the side, and the upper nozzles improves the cooling and the cleaning effect.

A suction means such as the vacuum suction pump which supplies the suction force through the suction nozzle can remove the silicon particles which are created on the top surface of the wafer during the wafer sawing process. The suction means is preferably installed adjacent to and behind the cutting edge of the scribing blade in the driving direction, close to regions on which the silicon particles are concentrated, so that the silicon particles are suctioned up as soon as they are created. Further, the suction force of the vacuum suction pump according to the present invention can remove even fine silicon particles which float in the air, and can prevent a back current of the silicon particles due to rotation of the scribing blade.

The wafer sawing apparatus according to the present invention can improve the yields after wafer scribing and further improve the subsequent manufacturing process steps by effectively removing silicon particles which are created during the wafer sawing process.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

For example, although an embodiment according to the present invention uses a wafer sawing apparatus, which is modified from the model DFD-640 manufactured by DISCO, and a wafer comprising CCDs, it should be clearly understood that many variations and/or modifications of the wafer sawing apparatus and the wafer for use on other models of sawing apparatus and other wafers having a plurality of other types of devices will also fall within the spirit and scope of the present invention as defined in the appended claims.

What is claimed is:

1. A wafer sawing apparatus for scribing a wafer having a plurality of integrated circuits (ICs) which are separated from each other by a plurality of scribe streets, the wafer sawing apparatus comprising:

a scribing blade which rotates and moves along the scribe streets;

an ejection assembly comprising two side nozzles and a center nozzle, the side nozzles being respectively positioned on each side of the scribing blade and ejecting a washing solution onto the scribing blade and a top surface of the wafer through an arc measuring about 23.5° to about 43.5° between an upper line of spray and a lower line of spray of the washing solution, and the center nozzle being positioned adjacent to and ahead of a cutting edge of the scribing blade in a driving direction of the scribing blade and ejecting the washing solution at a designated angle relative to horizontal onto the scribing blade and the top surface of the wafer; and a suction nozzle for suctioning silicon particles from the top surface of the wafer, where the particles are created by the scribing blade abrading the wafer along the scribe streets.

2. The wafer sawing apparatus of claim 1, wherein the ejection assembly further comprises an upper nozzle which is positioned adjacent to and above the cutting edge of the scribing blade and ejects the washing solution onto the top surface of the wafer perpendicular to the top surface.

3. The wafer sawing apparatus of claim 1, wherein the suction nozzle is controlled so that it is activated before the ejection assembly.

4. The wafer sawing apparatus of claim 1, wherein the suction nozzle is positioned adjacent to and behind the cutting edge of the scribing blade in the driving direction.

5. The wafer sawing apparatus of claim 2, wherein an ejection pressure of the washing solution through the upper nozzle is in a range from about 100 to about 140 kg/cm$^2$.

6. The wafer sawing apparatus of claim 1, wherein the center nozzle ejects the washing solution at an angle of about 5° to about 25° downward between a horizontal line passing through a center of the center nozzle and a central line passing through a center of spray of the washing solution as it is ejected from the center nozzle.

7. The wafer sawing apparatus of claim 6, wherein the angle at which the center nozzle ejects washing solution is 15°.

8. The wafer sawing apparatus of claim 1, wherein the arc of spray of the side nozzles measures 33.5°.

9. The wafer sawing apparatus of claim 1, wherein both the ejection assembly and the suction nozzle are connected to a body of the wafer sawing apparatus.

10. The wafer sawing apparatus of claim 1, wherein the washing solution is deionized water having a conductivity of about 200–400 k$\Omega$m.

11. The wafer sawing apparatus of claim 1, wherein the particles are created by the scribing blade abrading a wafer having no passivation layer.

12. A wafer sawing apparatus for scribing a wafer having a plurality of integrated circuits (ICs) which are separated from each other by a plurality of scribe streets, the wafer sawing apparatus comprising:

a scribing blade which rotates and moves along the scribe streets;

an ejection assembly comprising two side nozzles and a center nozzle, the side nozzles being respectively positioned on each side of the scribing blade and ejecting a washing solution onto the scribing blade and a top surface of the wafer through an arc measuring a designated angle, and the center nozzle being positioned adjacent to and ahead of a cutting edge of the scribing blade in a driving direction of the scribing blade and ejecting the washing solution at a designated angle relative to horizontal onto the scribing blade and the top surface of the wafer; and a suction nozzle positioned adjacent to and behind the cutting edge of the scribing blade in the driving direction, the suction nozzle being spaced horizontally and vertically from the scribing blade and the top surface of the wafer, the suction nozzle having an opening confronting the scribing blade for suctioning silicon particles and the washing solution from the top surface of the wafer and for suctioning airborne silicon particles above the top surface of the wafer, where the silicon particles are created by the scribing blade abrading the wafer along the scribe streets.

* * * * *